US012721098B2

(12) United States Patent
Kodama et al.

(10) Patent No.: US 12,721,098 B2
(45) Date of Patent: Aug. 25, 2026

(54) SUBSTRATE PROCESSING SYSTEM AND CONDITION MONITORING METHOD

(71) Applicant: Tokyo Electron Limited, Tokyo (JP)

(72) Inventors: Toshiaki Kodama, Yamanashi (JP); Takeshi Niidome, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 462 days.

(21) Appl. No.: 18/273,318

(22) PCT Filed: Jan. 17, 2022

(86) PCT No.: PCT/JP2022/001413
§ 371 (c)(1),
(2) Date: Jul. 20, 2023

(87) PCT Pub. No.: WO2022/163408
PCT Pub. Date: Aug. 4, 2022

(65) Prior Publication Data

US 2024/0087936 A1 Mar. 14, 2024

(30) Foreign Application Priority Data

Jan. 29, 2021 (JP) ................................ 2021-012926

(51) Int. Cl.
*H10P 72/30* (2026.01)
*G01J 5/48* (2022.01)
(Continued)

(52) U.S. Cl.
CPC ............ *H10P 72/3411* (2026.01); *G01J 5/48* (2013.01); *H10P 72/0464* (2026.01);
(Continued)

(58) Field of Classification Search
CPC ...... G05B 23/02; G05B 13/02; G05B 19/042; G05B 19/418; H01L 21/67248;
(Continued)

(56) References Cited

U.S. PATENT DOCUMENTS 5,718,511 A * 2/1998 Mundt .............. H01J 37/32935 374/162
6,123,766 A * 9/2000 Williams ................ C30B 25/16 117/85

(Continued)

FOREIGN PATENT DOCUMENTS

| JP | 2016-100407 A | 5/2016 |
|---|---|---|
| JP | 2020-096079 A | 6/2020 |
| KR | 1020200010180 A | 1/2020 |

*Primary Examiner* — Ronald D Hartman, Jr.
(74) *Attorney, Agent, or Firm* — Nath, Goldberg & Meyer; Jerald L. Meyer; Tanya E. Harkins

(57) ABSTRACT

A substrate processing system is provided with: a substrate processing apparatus including a loading/unloading port for a substrate and configured to execute predetermined processing on the substrate; a transfer device connected to the substrate processing apparatus via an opening/closing mechanism configured to open/close the loading/unloading port, and including a substrate transfer mechanism configured to load and unload the substrate into and from the substrate processing apparatus via the loading/unloading port; a thermal image generator provided on the substrate transfer mechanism and configured to generate a thermal image; and a control device. The control device is configured to: open, by the opening/closing mechanism, the loading/unloading port at a time at least either before or after the substrate processing apparatus executes the predetermined processing; and generate, by the thermal image generator, an in-apparatus thermal image as the thermal image indicating a temperature distribution inside the substrate processing apparatus.

18 Claims, 8 Drawing Sheets

(51) Int. Cl.
*H10P 72/00* (2026.01)
*H10P 72/50* (2026.01)

(52) U.S. Cl.
CPC ...... *H10P 72/0602* (2026.01); *H10P 72/3402* (2026.01); *H10P 72/53* (2026.01)

(58) Field of Classification Search
CPC ......... H01L 21/67196; H01L 21/67766; H01L 21/67742; H01L 21/67132; H01L 21/67155; H01L 21/68707; G01J 5/00
USPC .......................................................... 700/121
See application file for complete search history.

(56) References Cited

U.S. PATENT DOCUMENTS 6,160,621 A * 12/2000 Perry ................. G01B 11/0683 250/559.27
6,423,947 B2 * 7/2002 Womack ........... H01L 21/67109 118/724
6,591,160 B2 * 7/2003 Hine ................... H10P 72/0606 700/229
6,934,606 B1 * 8/2005 Genetti ............... H10P 72/3408 118/712
7,159,846 B2 * 1/2007 Aggarwal ............... F16K 51/00 251/330
8,109,699 B2 * 2/2012 Chen ..................... B23B 29/046 407/103
9,023,664 B2 * 5/2015 Chang ............... H01J 37/32889 438/5
9,435,692 B2 * 9/2016 Waldmann .............. G01J 5/025
2003/0198376 A1 * 10/2003 Sadighi .................. B25J 9/1697 382/153
2007/0291816 A1 * 12/2007 Volf ...................... G01J 5/0003 374/1
2008/0170842 A1 * 7/2008 Hunter .............. H01L 21/67248 392/416
2009/0314205 A1 * 12/2009 Patalay .............. G02B 23/2492 118/713
2012/0183915 A1 * 7/2012 Merry ..................... C23C 16/52 432/49
2015/0159769 A1 * 6/2015 Sheu ....................... F16K 51/02 251/129.15
2020/0235017 A1 * 7/2020 Jadhav .................. G01J 5/0215

* cited by examiner

SUBSTRATE PROCESSING SYSTEM AND CONDITION MONITORING METHOD

This is a National Phase Application filed under 35 U.S.C. 371 as a national stage of PCT/JP2022/001413, filed Jan. 17, 2022, an application claiming the benefit of Japanese Application No. 2021-012926, filed Jan. 29, 2021, the content of each of which is hereby incorporated by reference in its entirety.

TECHNICAL FIELD

The present disclosure relates to a substrate processing system and a condition monitoring method.

BACKGROUND

Patent Document 1 discloses a plasma etching apparatus including a processing container in which a substrate is accommodated and whose interior can be reduced in pressure, a lower electrode provided inside the processing container and on which a substrate transferred into the processing container by a transfer device is placed, and a focus ring provided to surround the periphery of the lower electrode.

PRIOR ART DOCUMENT

Patent Document

Patent Document 1: Japanese Laid-Open Patent Publication No. 2016-100407

A technique according to the present disclosure monitors an internal temperature of a substrate processing apparatus without changing a configuration of the substrate processing apparatus.

SUMMARY

According to an aspect of the present disclosure, a substrate processing system is provided with: a substrate processing apparatus including a loading/unloading port for a substrate and configured to execute a predetermined processing on the substrate; a transfer device connected to the substrate processing apparatus via an opening/closing mechanism configured to open/close the loading/unloading port, and including a substrate transfer mechanism configured to load and unload the substrate into and from the substrate processing apparatus via the loading/unloading port; a thermal image generator provided on the substrate transfer mechanism and configured to generate a thermal image; and a control device, wherein the control device is configured to: open, by the opening/closing mechanism, the loading/unloading port at a time at least either before or after the substrate processing apparatus executes the predetermined processing; and generate, by the thermal image generator, an in-apparatus thermal image as the thermal image indicating a temperature distribution inside the substrate processing apparatus.

According to the present disclosure, it is possible to monitor an internal temperature of a substrate processing apparatus without changing a configuration of the substrate processing apparatus.

BRIEF DESCRIPTION OF DRAWINGS

FIG. 4 is a view illustrating an example of a position of a thermography camera when generating an in-apparatus thermal image.

FIG. 6 is a view for explaining an example of a jig used for generating the in-apparatus thermal image.

FIG. 7 is a side view illustrating another example of the jig used for generating the in-apparatus thermal image.

DETAILED DESCRIPTION

Figure 1:
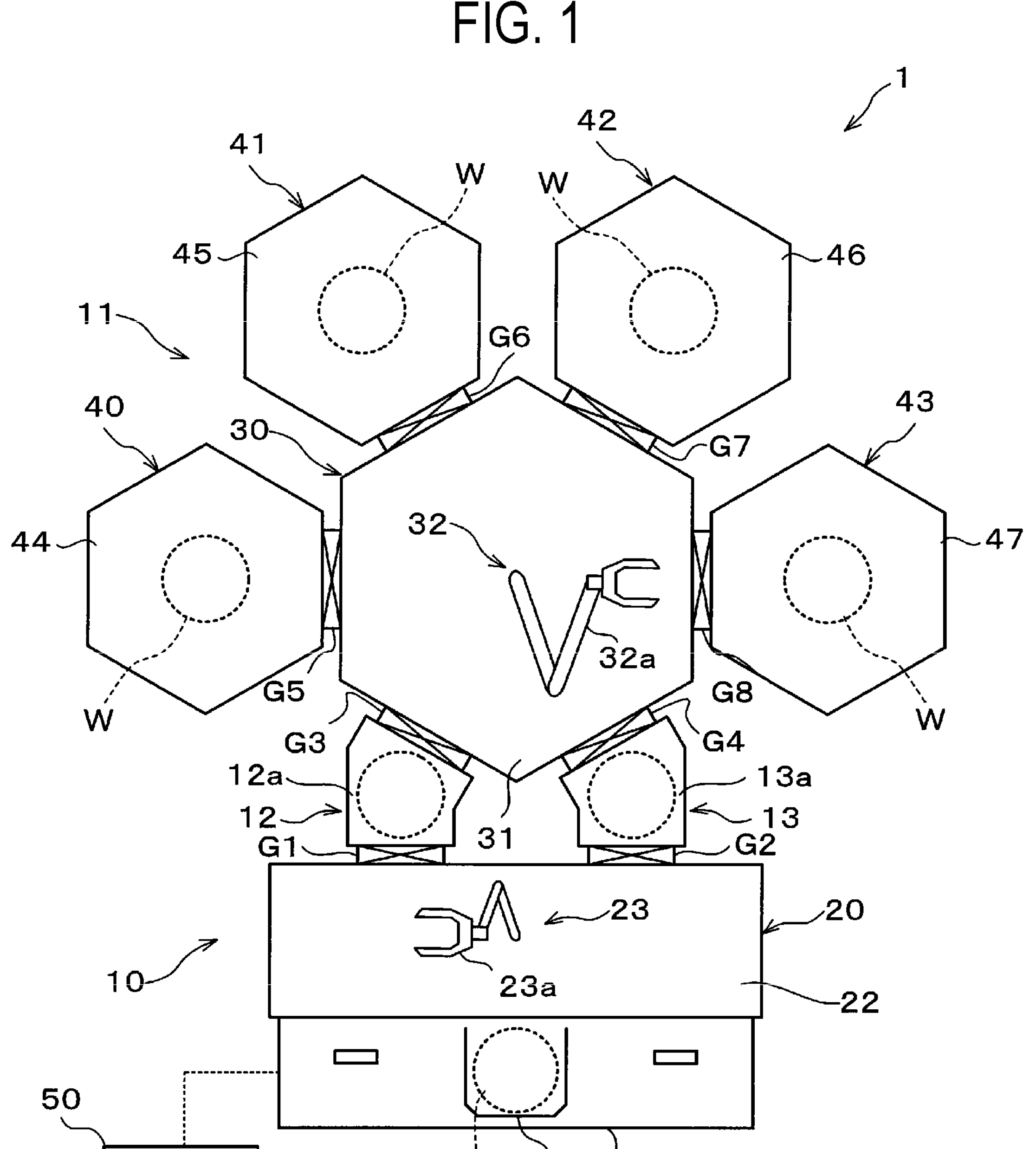
FIG. 1 is a plan view illustrating an outline of a configuration of a wafer processing system as a substrate processing system according to an embodiment.

For example, in a process of manufacturing a semiconductor device or the like, predetermined processing, such as film formation, etching or the like, is executed on a substrate such as a semiconductor wafer (hereinafter, referred to as a "wafer") by a substrate processing apparatus.

In addition, a temperature of a member constituting the substrate processing apparatus is adjusted to a desired temperature during the above-described predetermined processing. For example, a temperature of a stage on which the substrate is placed, a temperature of a wall of a processing container in which the stage is accommodated, and the like are adjusted to desired temperatures. The reason why such temperature adjustment is performed is that the temperatures of the stage and the like affect the results of the predetermined processing.

However, when the processing is repeated, there may be cases where normal processing results are not obtained even when the processing is performed under processing conditions that have provided normal processing results in the past. The following may be considered as one of the reasons for this. That is, as the processing is repeated, conditions of a processing space-side surface of the stage, the processing container, or the like change. When the conditions of the processing space-side surface change in this way, the surface does not reach a desired temperature even when the temperature adjustment is performed as described above. As a result, it is thought that conditions of a processing gas within the processing space do not reach the desired conditions and when plasma is used for processing, the conditions of the plasma within the processing space do not reach the desired conditions, which makes it impossible to obtain normal processing results.

Therefore, monitoring an internal temperature of the processing apparatus, specifically, monitoring temperatures of surfaces of internal constituent members that constitute the processing container has been considered. By reflecting the results of this monitoring in the above-described temperature adjustment or the like, it is possible to suppress normal processing results from being obtained when the processing is repeated. However, the processing container of the existing substrate processing apparatus is not provided with a monitoring window for monitoring an internal temperature of the processing apparatus, that is, a view port. When such a view port is added to the processing container, conditions of the processing space within the processing container will change significantly, requiring a drastic review of the processing conditions.

Therefore, the technique according to the present disclosure monitors an internal temperature of a substrate processing apparatus without changing a configuration of the substrate processing apparatus.

Hereinafter, a substrate processing system and a temperature monitoring method according to the present embodiment will be described with reference to the drawings. In the specification and drawings, elements having substantially the same functional configurations will be denoted by the same reference numerals and redundant descriptions thereof will be omitted.

<Wafer Processing System>

FIG. 1 is a plan view schematically illustrating an outline of a configuration of a wafer processing system 1 as the substrate processing system according to the present embodiment.

The wafer processing system 1 of FIG. 1 performs predetermined processing, such as film formation, diffusion, or etching, on a wafer W as a substrate under a reduced pressure.

The wafer processing system 1 has a configuration in which a carrier station 10 through which a carrier C capable of accommodating a plurality of wafers W is loaded or unloaded, and a processing station 11 including a plurality of various processing modules, each of which is configured to perform predetermined processing on the wafer W under a reduced pressure, are integrally connected to each other. The carrier station 10 and the processing station 11 are connected via two load-lock apparatuses 12 and 13.

The load-lock apparatuses 12 and 13 include respective load-lock chambers 12*a* and 13*a* configured to switch interiors thereof between an atmospheric pressure state and a vacuum state.

The load-lock apparatuses 12 and 13 are provided so as to connect an atmospheric transfer device 20 and a vacuum transfer device 30, which will be described later.

The carrier station 10 includes the atmospheric transfer device 20 and a carrier stage 21. The carrier station 10 may be further provided with an orienter (not illustrated) configured to adjust an orientation of the wafer W.

The atmospheric transfer device 20 includes an atmospheric transfer chamber 22 whose interior is at an atmospheric pressure. The atmospheric transfer chamber 22 is connected to the load-lock chambers 12*a* and 13*a* of the load-lock apparatuses 12 and 13 via gate valves G1 and G2. A transfer mechanism 23 is provided inside the atmospheric transfer chamber 22. The transfer mechanism 23 is configured to be capable of transferring the wafer W between the load-lock chambers 12*a* and 13*a* at an atmospheric pressure.

The transfer mechanism 23 includes a transfer arm 23*a*. The transfer arm 23*a* is configured as, for example, an articulated arm provided with a wafer holder configured to hold the wafer W at a tip thereof. The transfer mechanism 23 is configured to transfer the wafer W while holding the wafer W by the transfer arm 23*a*.

The carrier stage 21 is provided on a side surface of the atmospheric transfer device 20 opposite to the load-lock apparatuses 12 and 13. In the illustrated example, the carrier stage 21 is configured such that a plurality (e.g., three) of carriers C can be placed thereon. The wafers W in the carriers C placed on the carrier stage 21 are loaded into and unloaded from the atmospheric transfer chamber 22 by the transfer arm 23*a* of the transfer mechanism 23 of the atmospheric transfer device 20.

The processing station 11 includes a vacuum transfer device 30 and processing apparatuses 40 to 43.

The vacuum transfer device 30 includes a vacuum transfer chamber 31 whose interior is maintained in a reduced pressure state (a vacuum state). The vacuum transfer chamber 31 is connected to the load-lock chambers 12*a* and 13*a* of the load-lock apparatuses 12 and 13 via gate valves G3 and G4. In addition, the vacuum transfer chamber 31 is connected to each of vacuum chambers 44 to 47 to be described later via gate valves G5 to G8. A wafer transfer mechanism 32, as a substrate transfer mechanism, for transferring the wafer W is provided inside the vacuum transfer chamber 31. The wafer transfer mechanism 32 loads and unloads the wafer W with respect to each of the processing apparatuses 40 to 43 via a loading/unloading port 100*a* which will be described later. The wafer transfer mechanism 32 includes a transfer arm 32*a*. Details of a configuration of the wafer transfer mechanism 32 will be described later.

Each of the processing apparatuses 40 to 43 performs predetermined processing, such as film formation, diffusion, and etching on the wafer W under a reduced pressure. In the present embodiment, it is assumed that the processing apparatuses 40 to 43 perform etching using plasma. The processing apparatuses 40 to 43 include respective vacuum processing chambers 44 to 47 within each of which etching is performed on the wafer W under a reduced pressure.

In addition, the wafer processing system 1 includes a control device 50. The control device 50 includes a controller 51 and a display 52 as a notifier.

The controller 51 is provided with, for example, a computer equipped with a processor such as a CPU and a memory, and includes a storage (not illustrated) that stores various types of pieces of information. The storage stores programs for controlling wafer processing in the wafer processing system 1 and programs for monitoring internal temperatures of the processing apparatuses 40 to 43. The programs may be recorded in a computer-readable storage medium and installed on the control device 50 from the storage medium. In addition, the storage medium may be transitory or non-transitory. Some or all of the programs may be implemented by dedicated hardware (circuit board).

The display 52 displays various types of pieces of information, and includes a display device such as a liquid crystal display or an organic display.

<Processing Apparatus 40>

Figure 2:
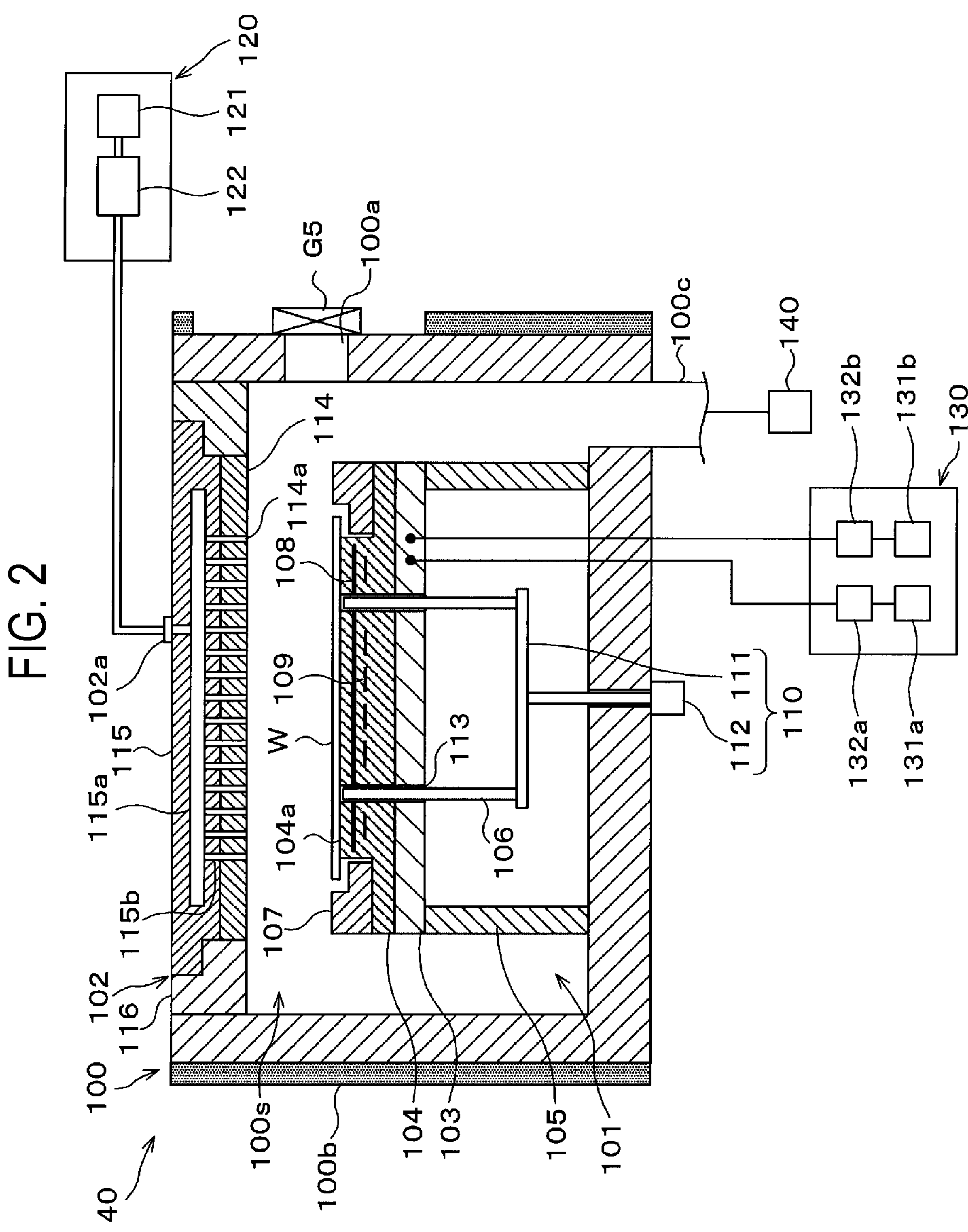
FIG. 2 is a vertical cross-sectional view illustrating an outline of a configuration of a processing apparatus.

Next, the processing apparatus 40 will be described with reference to FIG. 2. FIG. 2 is a vertical cross-sectional view illustrating an outline of a configuration of the processing apparatus 40.

As illustrated in FIG. 2, the processing apparatus 40 includes a processing container 100, a gas supplier 120, a radio frequency (RF) power supply 130, and an exhaust system 140. In addition, the processing apparatus 40 includes a pedestal 101 and a shower head 102.

The processing container 100 is a container whose interior is configured to be depressurized, and constitutes a vacuum processing chamber 44. The processing container 100 has, for example, a substantially cylindrical shape. A sidewall of the processing container 100 is provided with the loading/unloading port 100*a* for the wafer W. The loading/unloading 100*a* is provided with a gate valve G5 as an opening/closing mechanism to open/close the loading/unloading port 100*a*.

Further, a heater 100*b* is provided as a temperature adjuster for adjusting a temperature of the sidewall of the processing container 100. The heater 100*b* is provided along, for example, an outer surface of the sidewall of the processing container 100.

The pedestal 101 is disposed in a lower region of a plasma processing space 100*s* within the processing container 100.

The pedestal 101 is configured to support the wafer W in the plasma processing space 100*s*. The pedestal 101 includes a lower electrode 103, an electrostatic chuck 104, an insulator 105, and lifting pins 106.

The lower electrode 103 is made of a conductive material such as aluminum.

The electrostatic chuck 104 is provided on the lower electrode 103 and attracts and holds the wafer W by an electrostatic force. The electrostatic chuck 104 has a placement portion 104*a* on the wafer W is placed in the center of an upper surface thereof. In the electrostatic chuck 104, the upper surface of the placement portion 104*a* is higher than an upper surface of an outer peripheral portion thereof. A focus ring 107 is placed on the upper surface of the outer peripheral portion surrounding the placement portion 104*a* of the electrostatic chuck 104.

The focus ring 107 is an annular member disposed to surround the wafer W placed on the placement portion 104*a* of the electrostatic chuck 104, and is provided to improve, for example, the uniformity of plasma processing (in the present example, plasma etching). The focus ring 107 is formed of a material appropriately selected depending on the plasma processing to be performed, and is formed of, for example, silicon.

The placement portion 104*a* is provided with an electrode 108 configured to hold the wafer W by electrostatic attraction. The electrostatic chuck 104 has a configuration in which an electrode 108 is sandwiched between insulating materials.

A DC voltage from a DC power supply (not illustrated) is applied to the electrode 108. Due to the electrostatic force generated by the application, the wafer W is attracted and held on the upper surface of the placement portion 104*a* of the electrostatic chuck 104.

In addition, a heater 109 as a temperature adjuster for adjusting a temperature of the electrostatic chuck 104 is embedded below the electrode 108 in the electrostatic chuck 104. The heater 109 adjusts a temperature of the wafer W held by the electrostatic chuck 104 by adjusting the temperature of the electrostatic chuck 104.

Further, the heater 109 is configured to be capable of independently adjusting a temperature of each of multiple regions located in a radial direction of the wafer W. Specifically, the heater 109 includes, for example, a heater configured to heat a central region of the electrostatic chuck 104 in a plan view, and heaters configured to independently heat a plurality of annular regions arranged in order from the central region of the electrostatic chuck 104 in the plan view toward a radially outward direction of the electrostatic chuck 104.

As illustrated in FIG. 2, the insulator 105 supports the lower electrode 103. The insulator 105 is, for example, a cylindrical member having an outer diameter equivalent to an outer diameter of the lower electrode 103, and is made of ceramic or the like to support the peripheral edge side of the lower electrode 103.

The lifting pins 106 are columnar members that are raised and lowered so as to move up and down on the upper surface of the placement portion 104*a* of the electrostatic chuck 104, and are formed of, for example, ceramic. Three or more lifting pins 106 are provided at intervals from each other in a circumferential direction of the electrostatic chuck 104, specifically, a circumferential direction of the upper surface of the placement portion 104*a*.

The lifting pins 106 are connected to a lifting mechanism 110 that raises and lowers the lifting pins 106. The lifting mechanism 110 includes, for example, a support member 111 configured to support the plurality of lifting pins 106, and a driver 112 configured to generate a driving force for raising and lowering the support member 111 so as to raise and lower the plurality of lifting pins 106. The driver 112 includes an actuator such as a motor that generates a driving force.

The lifting pins 106 are inserted into respective through-holes 113 extending downward from the placement portion of the electrostatic chuck 104 to the bottom surface of the lower electrode 103.

Upper end surfaces of the lifting pins 106 support a rear surface of the wafer W when the lifting pins 106 are raised.

The shower head 102 has a function as an upper electrode and also functions as a shower head that supplies a processing gas from the gas supplier 120 to the plasma processing space 100*s*. The shower head 102 is disposed above the pedestal 101 and constitutes a portion of the ceiling of the processing container 100. The shower head 102 includes an electrode plate 114 disposed to face the interior of the processing container 100 and a support 115 provided above the electrode plate 114. In addition, the shower head 102 is supported by the upper portion of the processing container 100 via an insulative blocking member 116.

A plurality of ejection holes 114*a* are formed in the electrode plate 114, for example, at equal intervals. The ejection holes 114*a* eject the processing gas or the like to the plasma processing space 100*s*. Specifically, the ejection holes 114*a* eject the processing gas toward the wafer W that is attracted to and held by the electrostatic chuck 104 during plasma etching. In addition, the ejection holes 114*a* eject a cleaning gas toward the electrostatic chuck 104 during the cleaning of the processing apparatus 40. The electrode plate 114 is formed of, for example, silicon.

The support 115 detachably supports the electrode plate 114 and is formed of a conductive material such as aluminum. A gas diffusion chamber 115*a* is formed inside the support 115. A plurality of gas flow holes 115*b* in communication with the ejection holes 114*a* are formed in the side of the gas diffusion chamber 115*a*.

The gas supplier 120 includes one or more gas sources 121 and one or more flow rate controllers 122. The gas supplier 120 supplies, for example, one or more processing gases or one or more cleaning gases from respective gas sources 121 to the gas diffusion chamber 115*a* via respective flow rate controllers 122. Each flow rate controller 122 is, for example, a pressure control-type flow rate controller.

In the processing apparatus 40, a processing gas from one gas source 121 selected from the one or more gas sources 121 is supplied to the gas diffusion chamber 115*a* via the flow rate controller 122. Then, the processing gas supplied to the gas diffusion chamber 115*a* is dispersed and supplied in the form of a shower into the plasma processing space 100*s* via the gas flow holes 115*b* and the ejection holes 114*a*.

The processing apparatus 40 is configured such that a supply flow rate of the processing gas supplied from the shower head 102 is independently adjustable in each of the plurality of regions located in the radial direction of the wafer W. For example, in the processing apparatus 40, although not illustrated, the gas diffusion chamber 115*a* is divided into three or more gas diffusion chambers in the radial direction. The gas diffusion chambers 115*a* adjacent to each other are separated by a partition wall. Thus, a pressure of the processing gas supplied from the gas supplier 120 to each gas diffusion chamber 115*a* is individually adjustable.

The RF power supply 130 includes, for example, two RF generators 131*a* and 131*b* and two matching circuits 132*a* and 132*b*. The RF generator 131*a* and the RF generator 131*b* are connected to the lower electrode 103 via the matching circuits 132*a* and 132*b*, respectively, and supply RF power to the lower electrode.

The RF generator 131*a* generates and supplies RF power for plasma generation. A frequency of the RF power from the RF generator 131*a* is, for example, 27 MHz to 100 MHz. The matching circuit 132*a* includes a circuit for matching an output impedance of the RF generator 131*a* with an input impedance on a load (the lower electrode 103) side.

The RF generator 131*b* generates and supplies RF power for drawing ions into the wafer W (radio-frequency bias power). A frequency of the RF power from the RF generator 131*b* is, for example, 400 kHz to 13.56 MHz. The matching circuit 132*b* includes a circuit for matching an output impedance of the RF generator 131*b* with an input impedance on the load (the lower electrode 103) side.

The exhaust system 140 exhausts the interior of the plasma processing space 100*s* and includes a vacuum pump. The exhaust system 140 is connected to an exhaust port 100*c* provided in the bottom portion of the processing container 100.

The configurations of the processing apparatuses 41 to 43 are the same as the configuration of the processing apparatus 40 and thus a description thereof will be omitted.

Figure 3:
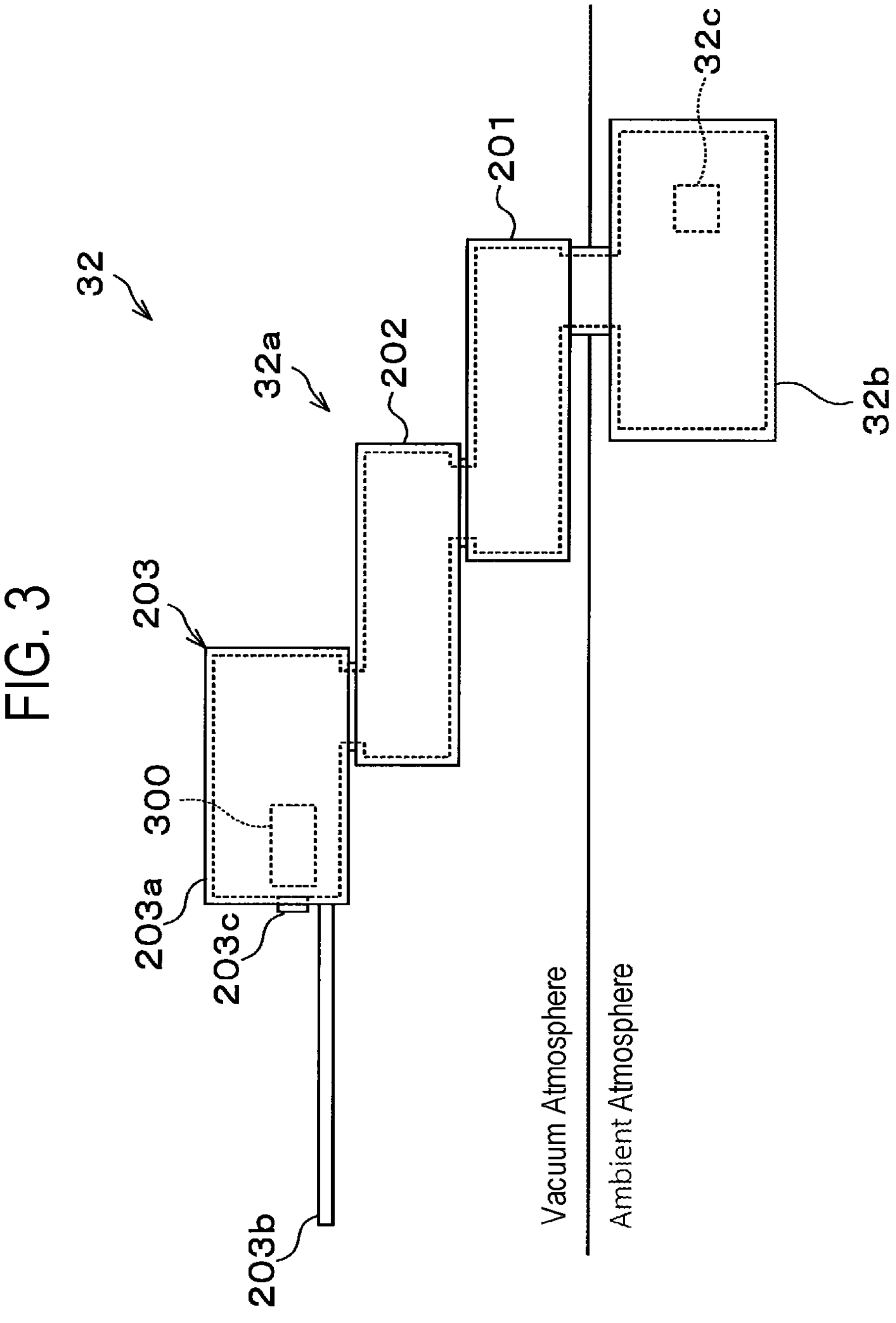
FIG. 3 is a side view schematically illustrating a configuration of a wafer transfer mechanism.
Figure 4:
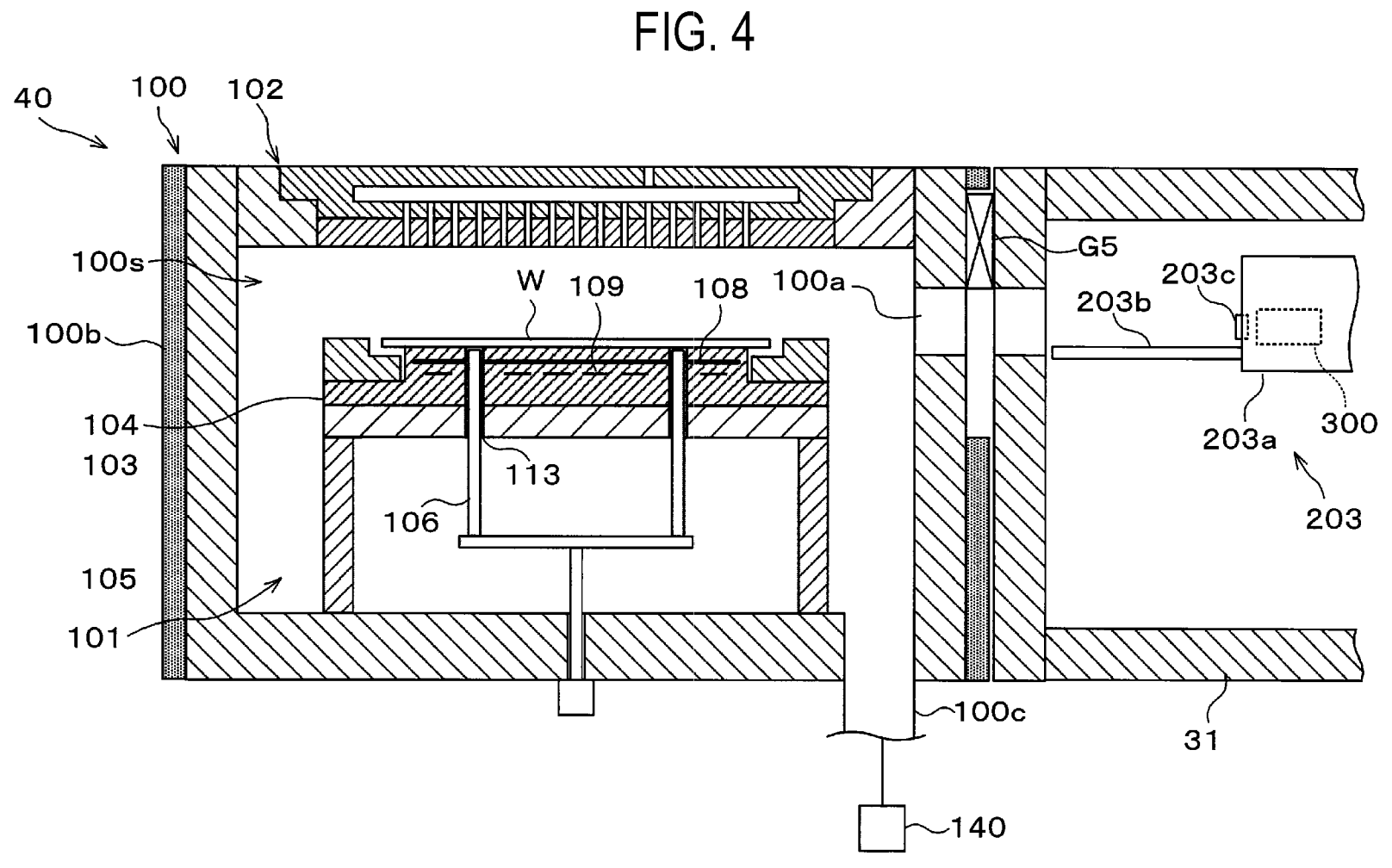

Next, the wafer transfer mechanism 32 will be described with reference to FIGS. 3 and 4. FIG. 3 is a side view schematically illustrating a configuration of the wafer transfer mechanism 32. FIG. 4 is a view illustrating an example of a position of a thermography camera 300, which will be described later, when generating an in-apparatus thermal image, which will be described later.

As illustrated in FIG. 3, the wafer transfer mechanism 32 includes a transfer arm 32*a* and a base 32*b*, and is configured to transfer the wafer W while holding the wafer W by the transfer arm 32*a*. The wafer transfer mechanism 32 may be provided with a plurality of transfer arms.

The transfer arm 32*a* is configured as, for example, an articulated arm. The base 32*b* pivotally supports a base end side of the transfer arm 32*a*.

The transfer arm 32*a* includes a first joint arm 201, a second joint arm 202, and a holding arm 203 as a substrate holder for holding the wafer W.

A base end side of the first joint arm 201 is connected to the base 32*b* to be rotatable around a vertical axis.

The second joint arm 202 is connected to a tip side of the first joint arm 201 to be rotatable around a vertical axis.

The holding arm 203 is connected to a tip side of the second joint arm 202 to be rotatable about a vertical axis.

The base 32*b* is provided with a driver 32*c* configured to drive the raising/lowering, rotating, and expanding/contracting of the transfer arm 32*a*. This driver includes an actuator, such as a motor, as a driving source that generates a driving force for raising/lowering the transfer arm 32*a*, a driving force for rotating the transfer arm 32*a* horizontally, and a driving force for expanding/contracting the transfer arm 32*a* in the horizontal direction.

The holding arm 203 includes a base end in which a root portion 203*a* having a hollow interior is provided, and a tip end in which a fork 203*b* configured to hold the wafer W is provided.

As the transfer arm 32*a* moves up and down, the fork 203*b* moves up and down. As the transfer arm 32*a* rotates or expands/contracts, the fork 203*b* moves in the horizontal direction.

In the wafer transfer mechanism 32, the transfer arm 32*a* is located inside the vacuum transfer chamber 31 kept in a vacuum atmosphere, or the like, and the base 32*b* is provided in a space below the vacuum transfer chamber 31 kept in an ambient atmosphere.

In addition, the interiors of the base 32*b*, the first joint arm 201, and the second joint arm 202 are all hollow like the root portion 203*a* on the base end side of the holding arm 203. In addition, an internal space of the root portion 203*a* of the holding arm 203 communicates with an internal space of the base 32*b* kept in an ambient atmosphere, via interiors of the first joint arm 201 and the second joint arm 202.

The wafer transfer mechanism 32 configured as described above is controlled by a transfer controller 51*b* of the control device 50, which will be described later.

In addition, the wafer transfer mechanism 32 is provided with a thermography camera 300 as a thermal image generator.

The thermography camera 300 generates a thermal image indicating a temperature distribution. Specifically, the thermography camera 300 generates an in-apparatus thermal image, which is the thermal image indicating the temperature distribution inside each of the processing apparatuses 40 to 43 (specifically, inside the processing container 100) that is subject to temperature monitoring. More specifically, the thermography camera 300 generates in-apparatus thermal images including thermal images of temperature adjustment targets (e.g., the sidewall of the processing container 100 and the electrostatic chuck 104) in each of the processing apparatuses 40 to 43.

In addition, the thermography camera 300 is controlled by a camera controller 51*c* of the control device 50, which will be described later. The thermal images generated by the thermography camera 300 are output to the control device 50 in, for example, a wired or wireless communication.

The thermography camera 300 includes, for example, an array sensor unit (not illustrated) in which sensors for detecting infrared rays are arranged in the form of an array.

The thermography camera 300 is provided, for example, inside the root portion 203*a* of the holding arm 203, which communicates with the internal space of the base 32*b* and becomes an ambient atmosphere. A window 203*c* for the thermography camera 300 is provided in the sidewall of the root portion 203*a* on the fork 203*b* side.

For example, as illustrated in FIG. 4, in the state of being located inside the vacuum transfer chamber 31 rather than being located inside the processing apparatus 40, the thermography camera 300 detects infrared rays emitted from the interior of the processing apparatus 40 and passing through the loading/unloading port 100*a* and the window 203, and generates in-apparatus thermal images of the processing apparatus 40 based on the detection results.

In the wafer processing system 1, the internal temperature of each of the processing apparatuses 40 to 43 is monitored by monitoring each of the in-apparatus thermal images of the processing apparatuses 40 to 43 generated by the thermography camera 300.

<Control Device 50>

Figure 5:
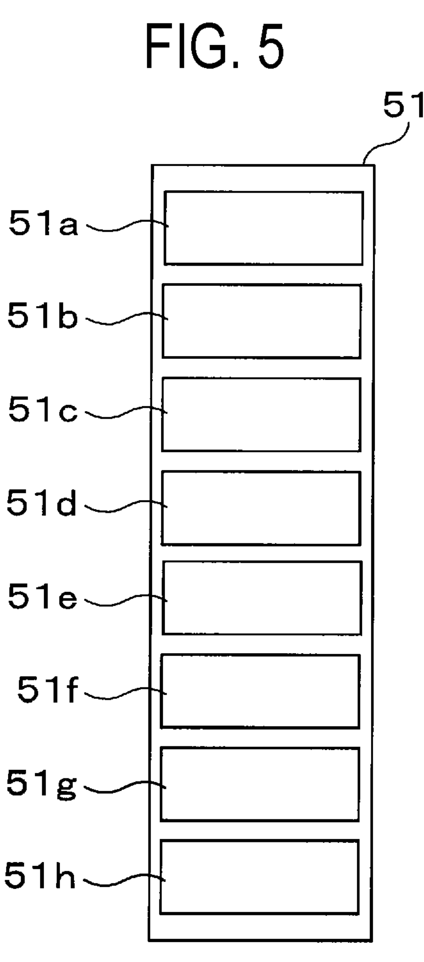
FIG. 5 is a functional block diagram of a controller of a control device in relation to monitoring of a temperature of the processing apparatus.

FIG. 5 is a functional block diagram of the controller 51 of the control device 50 in relation to the monitoring of the internal temperature of the processing apparatuses 40 to 43. In the following, each function of the controller 51 will be mainly described, by taking as an example, processing related to the processing apparatus 40. However, since the processing performed by each function of the controller 51 for the processing apparatuses 41 to 43 is the same as the processing performed for the processing apparatus 40, the description thereof will be omitted.

As illustrated in FIG. 5, the controller 51 includes an opening/closing controller 51*a*, a transfer controller 51*b*, a camera controller 51*c*, an acquisitor 51*d*, a temperature controller 51*e*, a requirement determinator 51*f*, a display controller 51*g*, and a reference acquisitor 51*h*, which are implemented when a processor such as a CPU reads out programs stored in a storage.

The opening/closing controller 51*a* controls the operations of the gate valves G1 to G7 to open/close the loading/unloading ports 100*a*. When an in-apparatus thermal image of the processing apparatus 40 is generated, the opening/closing controller 51*a* controls a driver (not illustrates), which drives the opening/closing of the gate valve G5, so that the gate valve G5 is in the open state.

The transfer controller 51*b* controls the transfer mechanism 23 and the wafer transfer mechanism 32. For example, when an in-apparatus thermal image of the processing apparatus 40 is generated, the transfer controller 51*b* controls the driver 32*c*, which drives the transfer arm 32*a*, such that the thermography camera 300 and the window 203*c*, which are provided in the holding arm 203, face the loading/unloading port 100*a* of the processing apparatus 40.

The camera controller 51*c* controls the generation of the thermal image by the thermography camera 300.

The acquisitor 51*d* acquires the thermal image generated by thermography camera 300, particularly an in-apparatus thermal image of the processing apparatus 40 generated by thermography camera 300. The acquisitor 51*d* opens the loading/unloading port 100*a* of the processing apparatus 40 under the control of the opening/closing controller 51*a* at a timing before the processing apparatus 40 performs etching, that is, predetermined processing. In this state, the acquisitor 51*d* causes the thermography camera 300 to generate an in-apparatus thermal image of the processing apparatus 40 under the control of the transfer controller 51*b* and the camera controller 51*c* and acquires the generated in-apparatus thermal image. The in-apparatus thermal image acquired by the acquisitor 51*d* is stored in a storage (not illustrated). In the following description, the "in-apparatus thermal image" basically means an in-apparatus thermal image generated and obtained at a time before performing the above-described predetermined processing.

The temperature controller 51*e* controls the heater 100*b* for the processing container 100 of the processing apparatus 40 and the heater 109 for the electrostatic chuck 104 of the processing apparatus 40. Specifically, the temperature controller 51*e* controls the heaters 100*b* and 109 based on the in-apparatus thermal image of the processing apparatus 40 such that the temperature distribution inside the processing apparatus 40 becomes a desired distribution.

The temperature controller 51*e* controls the heater 100*b* for the processing container 100 of the processing apparatus 40 based on the measurement result of a temperature sensor (not illustrates) that measures the temperature of the sidewall of the processing container 100 of the processing apparatus 40 and the in-apparatus thermal image of the processing apparatus 40 acquired by the acquisitor 51*d*. A specific example is as follows.

That is, the temperature controller 51*e* first determines whether or not a surface temperature of the sidewall of the processing container 100 on the processing space 100*s* side (hereinafter, referred to as an "inner wall surface temperature") is appropriate based on the in-apparatus thermal image of the processing apparatus 40. A specific example of this determination method will be described later. When the inner wall surface temperature of the processing container 100 is determined to be appropriate, the temperature controller 51*e* controls the heater 100*b* such that the sidewall of the processing container 100 has a set temperature based on the measurement result of the temperature sensor (not illustrated). On the other hand, when the inner wall surface temperature of the processing container 100 is determined not to be appropriate, the temperature controller 51*e* corrects the set temperature of the sidewall of the processing container 100. For example, when the inner wall surface temperature of the processing container 100 indicated by the in-apparatus thermal image of the processing apparatus 40 (which may be an average temperature or a maximum temperature) is higher than a reference value (hereinafter, referred to as a "sidewall reference value"), the temperature controller 51*e* corrects the set temperature of the sidewall of the processing container 100 to be lower. Thereafter, the temperature controller 51*e* controls the heater 100*b* based on the measurement result of the temperature sensor (not illustrated) such that the sidewall of the processing container 100 has the corrected set temperature.

In addition, in a case in which the sidewall is divided into a plurality of regions and each region is provided with an independently-controllable heater 100*b*, the temperature control of the sidewall of the processing container 100 described above may be performed for each region. As a result, a distribution of the inner wall surface temperature of the processing container 100 can be made to a desired temperature distribution.

Determination as to whether the inner wall surface temperature of the processing container 100 is appropriate may be performed based on, for example, whether the inner wall surface temperature of the processing container 100 indicated by the in-apparatus thermal image of the processing apparatus 40 is higher than the above-mentioned sidewall reference value. In addition, the above determination may be performed based on, for example, a model for determining suitability of the inner wall surface temperature of the processing container 100 (hereinafter, referred to as a "suitability determination model for sidewall") from an in-apparatus thermal image of the processing apparatus 40 created in advance by machine learning or the like.

In addition, the temperature controller 51*e* controls the heater 109 for the processing container 104 of the processing apparatus 40 based on the measurement result of a temperature sensor (not illustrated) that measures a temperature of the electrostatic chuck 104 of the processing apparatus 40 and the in-apparatus thermal image of the processing apparatus 40 acquired by the acquisitor 51*d*. A specific example is as follows.

That is, the temperature controller 51*e* first determines whether or not a surface temperature (hereinafter, referred to as a "upper surface temperature") of the electrostatic chuck 104 on the processing space 100*s* side is appropriate based on the in-apparatus thermal image of the processing apparatus 40. A specific example of this determination method will be described later. When the upper surface temperature of the electrostatic chuck 104 is determined to be appropriate, the temperature controller 51*e* controls the heater 109 based on the measurement result of the temperature sensor (not illustrated) such that the electrostatic chuck 104 has the set temperature. On the other hand, when the upper surface temperature of the electrostatic chuck 104 is determined not to be appropriate, the temperature controller 51*e* corrects the set temperature of the electrostatic chuck 104. For example, when the upper surface temperature of the electrostatic chuck 104 indicated by the in-apparatus thermal image of the processing apparatus 40 (which may be an average temperature or a maximum temperature) is higher than a reference value (hereinafter, referred to as a "chuck reference value"), the temperature controller 51$e$ corrects the set temperature of the electrostatic chuck 104 to be lower. Thereafter, the temperature controller 51$e$ controls the heater 109 based on the measurement result of the temperature sensor (not illustrated) such that the electrostatic chuck 104 has the corrected set temperature.

In a case in which the electrostatic chuck 104 is divided into a plurality of regions and each region is provided with an independently-controllable heater 109, the above-described temperature control of the electrostatic chuck 104 may be performed for each region. As a result, a distribution of the upper surface temperature of the electrostatic chuck 104 can be made to a desired temperature distribution.

Determination as to whether or not the upper surface temperature of the electrostatic chuck 104 is appropriate may be performed based on, for example, whether the upper surface temperature of the electrostatic chuck 104 indicated by the in-apparatus thermal image of the processing apparatus 40 is higher than the above-mentioned chuck reference value. In addition, the above determination may be performed based on, for example, a model for determining suitability of the upper surface temperature of the electrostatic chuck 104 (hereinafter, referred to as a "suitability determination model for chuck") from an in-apparatus thermal image of the processing apparatus 40 created in advance by machine learning or the like.

As described above, by making the distribution of the inner wall surface temperature of the processing container 100 and the distribution of the upper surface temperature of the electrostatic chuck 104 to desired temperature distributions, the temperature distribution in the entire processing apparatus 40 can be made to a desired temperature distribution.

The requirement determinator 51$f$ determines whether or not the processing apparatus 40 requires maintenance required based on the in-apparatus thermal image of the processing apparatus 40 acquired by the acquisitor 51$d$.

For example, the requirement determinator 51$f$ determines whether or not the processing apparatus 40 requires maintenance based on an in-apparatus thermal image of the processing apparatus 40 acquired by the acquisitor 51$d$ by using a model created in advance by machine learning or the like to determining whether or not the processing apparatus 40 requires maintenance based on the in-apparatus thermal image (hereinafter referred to as a "requirement determination model"). In addition, a single in-apparatus thermal image or a plurality of temporally-adjacent in-apparatus thermal images may be used to determine whether or not maintenance is required. When the plurality of temporally-adjacent in-apparatus thermal images are used, it is possible to determine whether or not the processing apparatus 40 requires maintenance based on time-dependent changes of the interior of the processing apparatus 40.

In addition, when the temperature indicated by the in-apparatus thermal image of the processing apparatus 40 exceeds a threshold, the requirement determinator 51$f$ may determine that the processing apparatus 40 requires maintenance. For example, the requirement determinator 51$f$ divides the in-apparatus thermal image of the processing apparatus 40 into a plurality of regions, and when a temperature indicated by one or more regions exceeds the threshold, determines that the processing apparatus 40 requires maintenance.

The expression "maintenance of the processing apparatus 40" may be maintenance of members constituting the processing apparatus 40, specifically, maintenance of the sidewall of the processing container 100, maintenance of the electrostatic chuck 104, or maintenance of the shower head 102.

For example, the requirement determinator 51$f$ determines whether or not the maintenance of the sidewall of the processing container 100 is required based on whether the inner wall surface temperature of the sidewall (which may be the average temperature or the maximum temperature) indicated by a portion corresponding to the sidewall of the processing apparatus 100 in the in-apparatus thermal image of the processing apparatus 40 acquired by the acquisitor 51$d$ exceeds a threshold ("sidewall threshold"). For example, when the inner wall surface temperature of the sidewall exceeds the threshold, the requirement determinator 51$f$ determines that the maintenance of the sidewall of the processing container 100 is required.

Similarly, the requirement determinator 51$f$ determines whether or not the maintenance of the electrostatic chuck 104 is required based on whether the upper surface temperature of the electrostatic chuck 104 indicated by the portion corresponding to the electrostatic chuck 104 in the in-apparatus thermal image of the processing apparatus 40 acquired by the acquisitor 51$d$ exceeds a threshold ("chuck threshold").

In addition, the requirement determinator 51$f$ determines whether or not the maintenance of the shower head 102 is required based on whether or not a bottom surface temperature of the shower head 102 indicated by the portion corresponding to the shower head 102 in the in-apparatus thermal image of the processing apparatus 40 acquired by the acquisitor 51$d$ exceeds a threshold ("shower threshold"). The temperature of the shower head 102 is increased by heat input from the plasma generated in the plasma processing space 100$s$. In addition, a degree of increase in the temperature of the shower head 102 varies depending on a degree of consumption of the shower head (specifically, a change in surface condition of the shower head 102 and a change in thickness of the shower head 102). Therefore, as described above, the requirement determinator 51$f$ determines whether or not the maintenance of the shower head 102 is required based on the in-apparatus image of the processing apparatus 40.

In addition to or instead of the above-described requirement determinator 51$f$, the controller 51 may include a determinator (not illustrated) configured to: specify, from the in-apparatus thermal image of the processing apparatus 40, a portion where the temperature indicated by the in-apparatus thermal image exceeds a threshold and has the largest difference from the threshold; and determine a constituent member of the processing apparatus 40 corresponding to the portion as a constituent member to be maintained.

The display controller 51$g$ controls the display 52.

For example, when the requirement determinator 51$f$ determines that the processing apparatus 40 requires maintenance, the display controller 51$g$ controls the display 52 to notify such a fact.

When it is determined that maintenance is required for the constituent member of the processing apparatus 40 such as the electrostatic chuck 104, the display controller 51$g$ may control the display 52 such that a message that prompts replacement or cleaning of the constituent member is displayed along with the maintenance requirement.

The reference acquisitor 51$h$ acquires the sidewall reference value, the suitability determination model for sidewall, the chuck reference value, and the suitability for determination model for chuck with respect to the processing apparatus 40, which are used in the temperature controller 51*e*. The acquisition of these reference values and models is performed, for example, as follows. That is, when the wafer processing system 1 is started up, each of the plurality of wafers W is subjected to predetermined processing, namely etching, in the processing apparatus 40. Then, for each wafer W, at a time before the predetermined processing, in-apparatus thermal images of the processing apparatus 40 are generated by the thermography camera 300 and accumulated in a storage (not illustrated). The reference acquisitor 51*h* acquires a sidewall reference value, a chuck reference value, a suitability determination model for sidewall, and a suitability determination model for chuck by performing calculation of the sidewall reference value and the chuck reference value and creation of the suitability determination model for sidewall and the suitability determination model for chuck by learning based on the in-apparatus thermal images of the processing apparatus 40 for each waver W accumulated as described above and processing result for each wafer W. In addition, the processing result for each wafer W is input from the outside via input means (not illustrated) such as a keyboard or an external interface such as a network interface.

In addition, the reference acquisitor 51*h* acquires a requirement determination model, a sidewall threshold, a chuck threshold, and a shower threshold, which are used by the requirement determinator 51*f*. These may be acquired, for example, by the same method as the suitability determination model for chuck, the sidewall reference value, and the like.

The sidewall reference value, the suitability determination model for sidewall, the chuck reference value, the suitability determination model for chuck, the requirement determination model, the sidewall threshold, the chuck threshold, and the shower threshold acquired by the reference acquisitor 51*h* for the processing apparatus 40 are stored in advance in a storage (not illustrated).

The sidewall reference value and the suitability determination model for sidewall calculated or created by the reference acquisitor 51*h* by using the processing apparatus 40 may be applied as the sidewall reference value and the suitability determination model for sidewall for the processing apparatus 41. The same applies to the chuck reference value, the suitability determination model for chuck, the requirement determination model, the sidewall threshold, the chuck threshold, and the shower threshold.

The sidewall reference value and the suitability determination model for sidewall for the processing apparatus 40 may be calculated or created in advance outside the wafer processing system 1 based on information obtained by an evaluator having the same configuration as the processing apparatus 40 and may be stored in advance in a storage (not illustrated) of the controller 51. The same applies to the chuck reference value, the suitability determination model for chuck, the requirement determination model, the sidewall threshold, the chuck threshold, and the shower threshold.

The controller 51 may include an abnormality determinator (not illustrated) that determines an abnormality in the processing apparatus 40 based on an in-apparatus thermal image of the processing apparatus 40 acquired by the acquisitor 51*d*. The expression "abnormality of the processing apparatus 40" may be an abnormality of a member constituting the processing apparatus 40.

In the case of including the abnormality determinator, when it is determined by the abnormality determinator that an abnormality occurs in the processing apparatus 40, the display controller 51*g* may control the display 52 to notify such a fact.

Next, an example of wafer processing performed by using the wafer processing system 1 configured as described above will be described. The following example is an example in which the wafer W is subjected to plasma etching by the processing apparatus 40.

For example, first, under the control of the transfer controller 51*b*, the wafer W is taken out from the carrier C by the transfer arm 23*a* of the transfer mechanism 23, and the gate valve G1 is opened under the control of the opening/closing controller 51*a*. Thereafter, under the control of the transfer controller 51*b*, the wafer W is loaded into the load-lock apparatus 12 by the transfer arm 23*a* and is received by the support (not illustrated) in the load-lock apparatus 12.

Subsequently, the transfer arm 23*a* is extracted from the load-lock apparatus 12 under the control of the transfer controller 51*b*, the gate valve G1 is closed under the control of the opening/closing controller 51*a* so that the interior of the load-lock apparatus 12 is sealed, and an internal pressure of the load-lock apparatus 12 is reduced to a predetermined pressure or less.

In parallel with the transfer of the wafer W by the above-described transfer mechanism 23 and the reduction in pressure, in other words, before the plasma etching, the acquisitor 51*d* acquires an in-apparatus thermal image of the processing apparatus 40. Specifically, under the control of the opening/closing controller 51*a*, the gate valve G5 is opened, the loading/unloading port 100*a* of the processing apparatus 40 is opened, and under the control of the transfer controller 51*b*, the transfer arm 32*a* is driven such that the thermography camera 300 faces the loading/unloading port 100*a* via the window 203*c*. In addition, under the control of the camera controller 51*c*, the thermography camera 300 generates an in-apparatus thermal image of the processing apparatus 40, and the acquisitor 51*d* acquires the generated in-apparatus thermal image. After the thermography camera 300 generates the in-apparatus thermal image of the processing apparatus 40, the loading/unloading port 100*a* of the processing apparatus 40 is closed under the control of the opening/closing controller 51*a*.

In addition, based on the acquired in-apparatus thermal image of the processing apparatus 40, the temperature controller 51*e* appropriately corrects the set temperatures of the sidewall of the processing container 100 and the electrostatic chuck 104 for the processing apparatus 40.

Further, based on the acquired in-apparatus thermal image of the processing apparatus 40, the requirement determinator 51*f* determines whether or not the processing apparatus 40 requires maintenance.

When it is determined that the processing apparatus 40 requires maintenance, for example, wafer processing is interrupted, and under the control of the display controller 51*g*, the fact that the processing apparatus 40 requires maintenance is displayed on the display 52. When it is determined that the processing apparatus 40 requires maintenance, a cleaning gas may be supplied to the processing container 100 of the processing apparatus 40 to perform cleaning.

In a case in which it is determined that the processing apparatus 40 does not require maintenance, when the internal pressure of the load-lock apparatus 12 becomes a predetermined pressure or lower, the gate valve G3 is opened under the control of the opening/closing controller 51*a*, and under the control of the transfer controller 51*b*, the wafer W is received from the support (not illustrated) in the load-lock apparatus 12 by the fork 203*b* of the wafer transfer mechanism 32 and taken out from the load-lock apparatus 12.

Next, after the gate valve G3 is closed under the control of the opening/closing controller 51*a*, the gate valve G5 for the processing apparatus 40 is opened. Subsequently, the fork 203*b* holding the wafer W is inserted into the pressure-reduced processing container 100 of the processing apparatus 40 under the control of the transfer controller 51*b*, that is, the wafer W is loaded into the processing apparatus 40. Thereafter, the lifting pins 106 are raised, the fork 203*b* is extracted from the processing container 100, and the wafer W is placed on the electrostatic chuck 104 in the processing container 100 via the lifting pins 106.

Subsequently, under the control of the opening/closing controller 51*a*, the gate valve G5 is closed, the processing container 100 of the processing apparatus 40 is hermetically sealed, and the internal pressure of the processing container 100 is reduced to a predetermined degree of vacuum by the exhaust system 140. In addition, a DC voltage is applied to the electrode 108 of the electrostatic chuck 104, whereby the wafer W is attracted to and held by the electrostatic chuck 104 by an electrostatic force.

Subsequently, the processing gas is supplied from the gas supplier 120 to the plasma processing space 100*s* via the shower head 102. In addition, radio-frequency power HF for plasma generation is supplied from the RF power supply 130 to the lower electrode 103, whereby the processing gas is excited and plasma is generated. At this time, radio-frequency power LF for attracting ions is also supplied from the RF power supply 130 to the lower electrode 103. Then, plasma etching is executed on the wafer W by the action of the generated plasma.

When the plasma etching is completed, the supply of the radio-frequency power HF and the radio-frequency power LF from the RF power supply 130 and the supply of the processing gas from the gas supplier 120 are stopped. Subsequently, the application of the DC voltage to the electrode 108 is stopped, and the attraction and holding of the wafer W by the electrostatic chuck 104 is stopped.

Thereafter, the gate valve G5 of the processing container 100 is opened, the fork 203*b* is moved into the processing container 100 of the processing apparatus 40, the lifting pins 106 are raised and lowered, and the wafer W is received by the fork 203*b*. Then, the wafer W is unloaded from the processing container 100 of the processing apparatus 40 in a reverse procedure to the loading of the wafer W into the processing container 100 of the processing apparatus 40, and a series of wafer processing processes is completed.

<Another Example of Time at which in-Apparatus Thermal Image is Generated>

In the above-described example, it has been assumed that the thermography camera 300 acquires the in-apparatus thermal image of the processing apparatus 40 at a time before the processing apparatus 40 executes etching, that is, predetermined processing. However, the time at which the in-apparatus thermal image of the processing apparatus 40 is generated may be after the processing apparatus 40 executes the predetermined processing, or may be both before and after the processing apparatus 40 executes the predetermined processing.

Main Effects of the Present Embodiment

As described above, in the present embodiment, the wafer processing system 1 includes the thermography camera 300 that is provided in the wafer transfer mechanism 32 and generates the thermal image.

In addition, for example, in a state of opening, by the gate valve G5, the loading/unloading port 100*a* of the processing apparatus 40 at a time at least either before or after the processing apparatus 40 executes the above-described predetermined processing, the controller 51 generates, by the thermography camera 300, a thermal image indicating the temperature distribution inside the processing apparatus 40, that is, an in-apparatus thermal image of the processing apparatus 40. In generating the in-apparatus thermal image of the processing apparatus 40, it is not necessary to change the configuration of the processing apparatus 40. Therefore, according to the present embodiment, the internal temperature of the processing apparatus 40 can be monitored without changing the configuration of the processing apparatus 40 from the existing one.

In addition, as described above, when a view port is provided and the internal temperature of the processing apparatus 40 is monitored, it is necessary to provide a shutter or the like in the view port in order to protect a monitoring device from plasma or the like. In contrast, in the present embodiment, during the processing in the processing apparatus 40, since the thermography camera 300 for monitoring the internal temperature of the processing apparatus 40 is located inside the vacuum transfer chamber 31 and the loading/unloading port 100*a* of the processing container 100 is closed, there is no need to provide such a shutter or the like.

Further, in the present embodiment, the thermography camera 300 is shared by the processing apparatuses 40 to 43 and is not provided individually for each of the processing apparatuses 40 to 43. Therefore, it is possible to monitor the temperature inside each of the processing apparatuses 40 to 43 while suppressing costs.

In addition, in the present embodiment, the internal temperature of the processing apparatus 40, specifically, the surface temperature of the temperature adjustment target on the processing space 100*s* side (e.g., the sidewall of the processing container 100) in the processing apparatus 40 is monitored. Then, based on the monitoring result, the temperature controller 51*e* adjusts a temperature adjustment mode of the temperature adjustment target, such as correcting the set temperature of the temperature adjustment target. Therefore, the surface temperature of the temperature adjustment target on the processing space 100*s* side can be made to a desired temperature.

In addition, in the present embodiment, the internal temperature of the processing apparatus 40 is monitored, and the requirement determinator 51*f* determines whether or not the processing apparatus 40 requires maintenance based on the monitoring result. Based on this determination result, it is possible to perform replacement and cleaning of a member constituting the processing apparatus 40 at an appropriate time before an abnormality occurs in the processing apparatus 40. As a result, it is also possible to prevent processing results from becoming abnormal in the processing apparatus 40.

In addition, in the present embodiment, since the in-apparatus thermal images of the processing apparatus 40 are generated and acquired by overlooking the entire interior of the processing apparatus 40 (specifically, the interior of the processing container 100), one in-apparatus thermal image includes information about temperature distributions of a plurality of members constituting the processing apparatus 40. Therefore, for all the constituent members of the processing apparatus 40 included in one in-apparatus thermal image, it is possible to determine whether or not maintenance is required or the like based on the in-apparatus thermal image of the one processing apparatus 40. Therefore, it is possible to shorten the time required for determining whether or not maintenance is required or the like.

In addition, according to the present embodiment, for all regions of the constituent members of the processing apparatus 40 included in one in-apparatus thermal image, it is possible to determine whether or not maintenance is required for each of the regions or the like based on an in-apparatus thermal image of the processing apparatus 40. Therefore, it is possible to shorten the time required to determine whether or not maintenance is required for all the regions of the constituent members of the processing apparatus 40 or the like <Another Example of Temperature Control by Temperature Controller 51*e*>

The temperature controller 51*e* may compare the in-apparatus thermal images of the processing apparatuses 40 to 43 with each other and may control the heater 100*b* for the sidewall of the processing container 100 of the processing apparatus 40 based on a comparison result. Specifically, for example, when there is a difference between a temperature indicated by a portion corresponding to the sidewall of the processing container 100 in the in-apparatus thermal image of the processing apparatus 40 and a temperature indicated by a portion corresponding to the sidewall of the processing containers 100 in the in-apparatus thermal image of each of the processing apparatuses 41 to 43, the temperature controller 51*e* corrects the set temperature of the sidewall of the processing container 100 for the processing apparatus 40 to eliminate such a difference.

Similarly, the heater 109 for the electrostatic chuck 104 may also be controlled based on the comparison result for in-apparatus thermal images of the processing apparatuses 40 to 43.

<Other Examples of Method of Using In-Apparatus Thermal Image>

When the wafer W is continuously processed in the wafer processing system 1, the acquisitor 51*d* may acquire in-apparatus thermal images before or after predetermined processing by the processing apparatuses 40 to 43, and the acquired in-apparatus thermal images may be stored in a storage (not illustrated) in association with processing conditions in the predetermined processing. Then, the controller 51 may extract, from the accumulated in-apparatus thermal images, an in-apparatus thermal image and a portion of the in-apparatus thermal image in which the temperature changes under the same processing condition, and a constituent member of the processing apparatus 40 to 43, which corresponds to the extracted portion, may be determined as a constituent member to be maintained. By notifying the constituent member determined to be maintained through the display 52, maintenance of a problematic portion can be prompted at an appropriate time.

In addition, correlations between the accumulated in-apparatus thermal images after processing and the processing results may be learned in advance by machine learning or the like. When the processing is actually performed, the controller 51 may determine that there is a possibility that processing has not been performed normally from the in-apparatus images after processing and the correlations.

<Other Examples of in-Apparatus Thermal Image>

Figure 6:
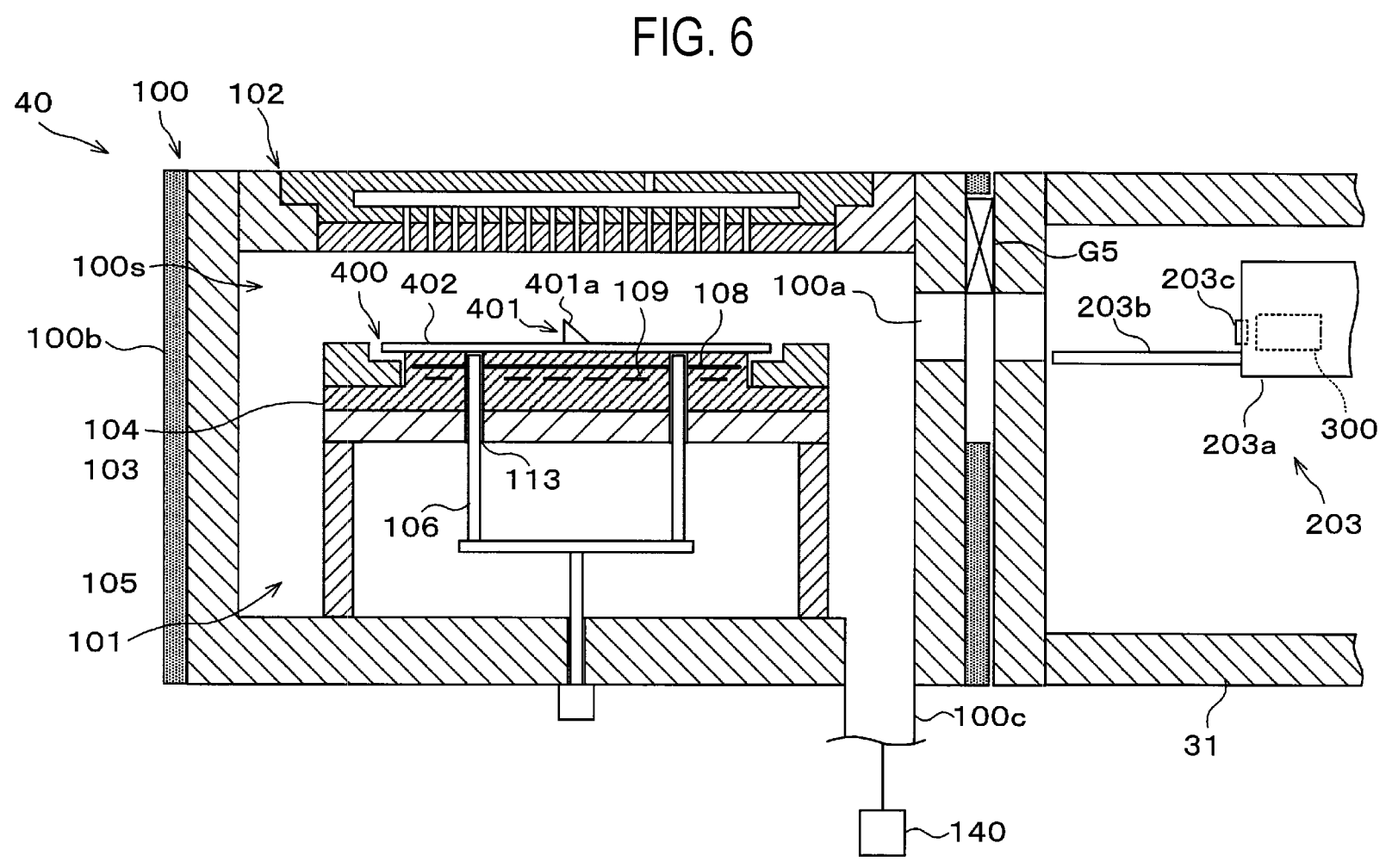

FIG. 6 is a view for explaining an example of a jig used for generating the in-apparatus thermal image.

As described above, the thermography camera 300 detects infrared rays emitted from the interior of the processing apparatus 40 and passing through the loading/unloading port 100*a* and the window 203*c*, for example, in the state of being located inside the vacuum transfer chamber 31 rather than located inside the processing apparatus 40, and generates an in-apparatus thermal image based on the detection result. Therefore, depending on a shape and size of the loading/unloading port 100*a*, the shower head 102 may be a dead angle portion with respect to the thermography camera 300, and the temperature of the shower head 102 may not be sufficiently reflected in the in-apparatus thermal image generated by the thermography camera 300.

In this case, the in-apparatus thermal image may be generated in a state in which for example, a jig 400 illustrated in FIG. 6 is located inside the processing apparatus 40

The jig 400 is configured to be transferred by the wafer transfer mechanism 32 or the transfer mechanism 23 and is provided with a reflecting member 401 configured to reflect the infrared rays toward the thermography camera 300. The reflecting member 401 is formed by using a material having low infrared emissivity.

In the illustrated example, the reflecting member 401 is provided on an upper surface of a jig main body 402 and has a reflecting surface 401*a* that horizontally reflects the infrared rays from above when the jig 400 is horizontally supported.

Therefore, when the jig 400 is horizontally supported by the pedestal 101 or the lifting pins 106, the infrared rays emitted from the dead angle portion of the thermography camera 300 in the shower head 102 and directed downward at the time of generating an in-apparatus captured image are reflected by the reflecting surface 401*a* and directed toward the loading/unloading port 100*a*. These infrared rays enter into the vacuum transfer chamber 31 via the loading/unloading port 100*a* and are incident on the thermography camera 300 facing the loading/unloading port 100*a* to be detected.

The jig 400 is accommodated in the carrier C, for example, like the wafer W.

When the thermography camera 300 generates (captures) the in-apparatus thermal image of the processing apparatus 40, the jig 400 is transferred from the carrier C to the load-lock chamber 12*a* or the load-lock chamber 13*a* by the transfer mechanism 23. Thereafter, the jig 400 is loaded into the processing container 100 of the processing apparatus 40 by the wafer transfer mechanism 32 and horizontally supported by, for example, the pedestal 101 or the raised lifting pins 106. In this state, the in-apparatus thermal image of the processing apparatus 40 is generated by the thermography camera 300 which is moved to a position facing the loading/unloading port of the processing apparatus 40 in the vacuum transfer chamber 31 rather than in the processing apparatus 40. At the time of this generation, as described above, the infrared rays emitted from the dead angle portion of the thermography camera 300 in the shower head 102 and directed downward are reflected by the reflecting surface 401*a* and are incident on the thermography camera 300 where the infrared rays are detected. Therefore, the in-apparatus thermal image of the processing apparatus 40 generated by the thermography camera 300 reflects the temperature of the dead angle portion in the shower head 102. In other words, by using the jig 400, it is possible to monitor the temperature of the dead angle portion in the shower head 102 as well.

The jig main body 402 is a member that imitates the wafer W, and specifically, is a member that is formed in a disk shape with the same diameter as the wafer W (e.g., 300 mm). In addition, the jig main body 402 has, for example, a notch (not illustrated) formed as in the wafer W. This notch is used when adjusting an orientation of the jig 400 in order to direct the infrared rays reflected by the reflecting member 401 within the processing container 100 toward the loading/unloading port 100*a*.

For example, a plurality of jigs 400 may be prepared, angles of reflecting surfaces 401*a* of reflecting members 401 of the plurality of jigs 400 may be made different from each other, and in-apparatus thermal images of the processing apparatus 40 may be generated by the thermography camera 300 by using respective jigs 400. This makes it possible to widen a temperature monitoring range in the shower head 102. For example, the temperature monitoring range can be widened to both a central portion and a peripheral portion of the shower head 102.

In addition, a plurality of jigs may be prepared, mounting positions of reflecting members of the plurality of jigs 400 may be made different from each other, and in-apparatus thermal images of the processing apparatus 40 may generated by the thermography camera 300 by using respective jigs 400. This also makes it possible to widen a temperature monitoring range in the shower head 102.

Figure 7:
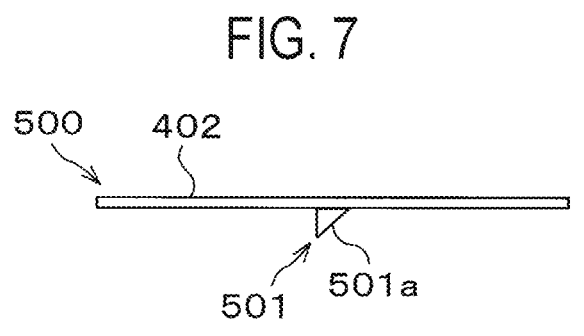

FIG. 7 is a side view illustrating another example of the jig used for generating the in-apparatus thermal image.

Similar to the jig 400 in FIG. 6, the jig 500 in FIG. 7 is configured to be transferred by the wafer transfer mechanism 32 and the transfer mechanism 23 and is provided with a reflecting member 501 configured to reflect infrared rays toward the thermography camera 300.

However, the jig 500 differs from the jig 400 in FIG. 6 in that the reflecting member 501 has a reflecting surface 501*a* provided on a bottom surface of the jig main body 402 and configured to reflect infrared rays from below in a horizontal direction when the jig 500 is horizontally supported.

This jig 500 is used while being horizontally supported by the raised lifting pins 106 when the thermography camera 300 generates an in-apparatus thermal image.

By generating the in-apparatus thermal image by the thermography camera 300 with the jig 500, the temperature of the dead angle portion in the electrostatic chuck 104 from the thermography camera 300 within the vacuum transfer chamber 31 can be reflected in the in-apparatus thermal image. In other words, by using the jig 500, it is possible to monitor the temperature of the dead angle portion of the thermography camera 300 in the shower head 102 as well.

<Other Examples of Arrangement Position of Thermography Camera>

Figure 8:
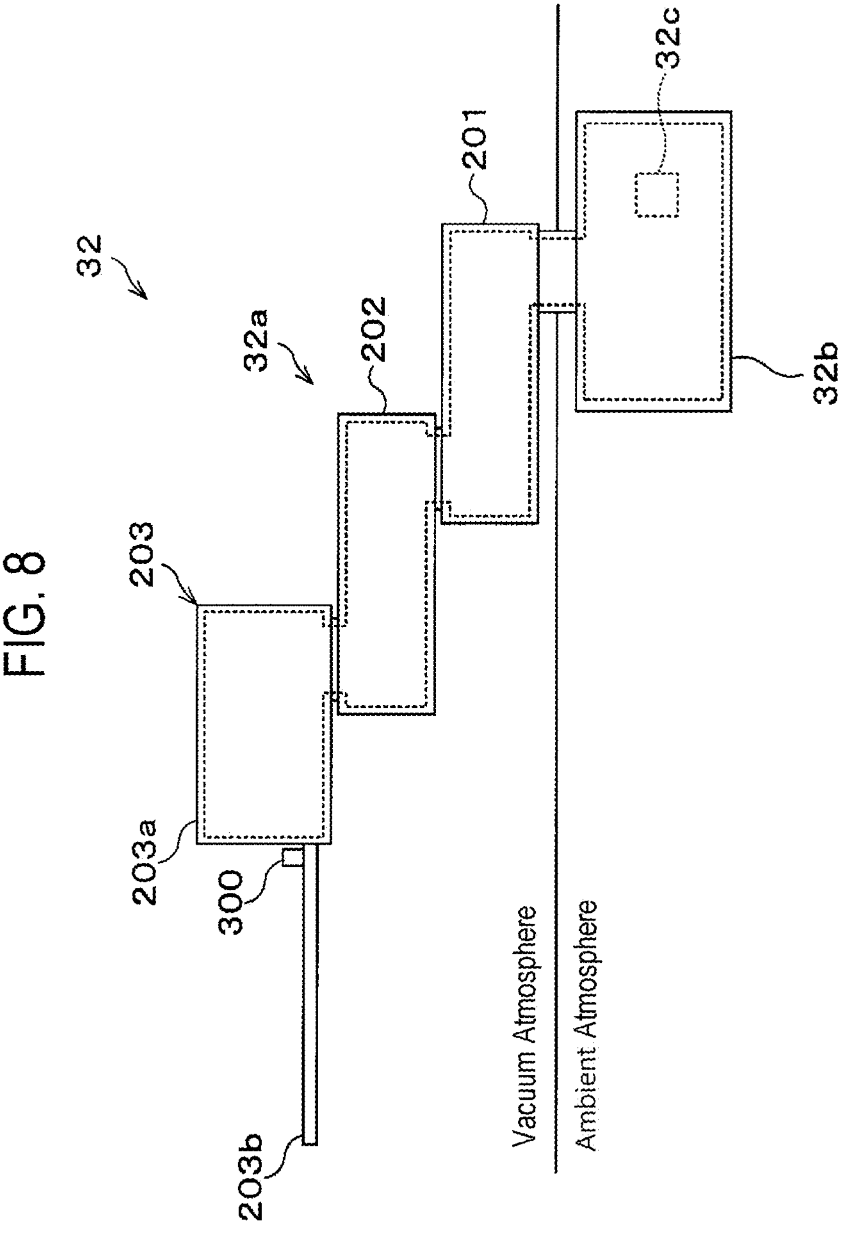
FIG. 8 is a view for explaining another example of an arrangement position of the thermography camera.

FIG. 8 is a view for explaining another example of an arrangement position of the thermography camera.

In the above example, the thermography camera 300 is provided in the interior of the root portion 203*a* on the base end side of the holding arm 203, wherein the interior has an ambient atmosphere. When the thermography camera 300 is also capable of operating under a reduced pressure, the thermography camera 300 may be provided on the base portion of the fork 203*b* as illustrated in FIG. 8. In addition, the thermography camera 300 may be provided at the tip of the fork 203*b* as long as it does not interfere with the holding of the wafer W by the fork 203*b*.

When the thermography camera 300 is provided on the fork 203*b* in this way, the thermography camera 300 generates the in-apparatus thermal image of the processing apparatus 40 in the state of being located inside the processing apparatus 40 under the control of the transfer controller 51*b* and the camera controller 51*c*. This makes it possible to easily expand the temperature monitoring range within the processing apparatus 40.

In addition, when the thermography camera 300 is provided on the fork 203*b*, the thermography camera 300 may be provided for each monitoring target. For example, a total of three thermography cameras 300 may be provided for the sidewall of the processing container 100, the electrostatic chuck 104, and the shower head 102.

Modifications

In addition to the thermography camera 300, a capturing device may be provided on the wafer transfer mechanism 32 (specifically, the transfer arm 32*a*).

Then, the controller 51 may cause the capturing device to capture an image of a portion of the processing apparatus 40, which corresponds to a specific portion of the in-apparatus thermal image generated by the thermography camera 300 (e.g., a portion where a temperature indicated by the image exceeds a threshold for determining whether or not maintenance is required).

It is to be considered that the embodiments disclosed herein are exemplary in all respects and not restrictive. The embodiments described above may be omitted, replaced, or modified in various forms without departing from the scope and spirit of the appended claims.

EXPLANATION OF REFERENCE NUMERALS

1: wafer processing system, 30: vacuum transfer device, 32: wafer transfer mechanism, 40 to 43: processing apparatus, 50: control device, 100*a*: loading/unloading port, 300: thermography camera, G5 to G8: gate valve, W: wafer

What is claimed is:

1. A substrate processing system comprising:

a substrate processing apparatus including a loading/unloading port for a substrate and configured to execute a predetermined processing on the substrate;

a transfer device connected to the substrate processing apparatus via an opening/closing mechanism configured to open/close the loading/unloading port, and including a substrate transfer mechanism configured to load and unload the substrate into and from the substrate processing apparatus via the loading/unloading port;

a thermal image generator provided on the substrate transfer mechanism and configured to generate a thermal image; and a control device, wherein the control device is configured to:

open, by the opening/closing mechanism, the loading/unloading port at a time before and/or after the substrate processing apparatus executes the predetermined processing; and generate, by the thermal image generator, an in-apparatus thermal image as the thermal image indicating a temperature distribution inside the substrate processing apparatus, wherein the control device is further configured to generate, by the thermal image generator, the in-apparatus thermal image in a state in which the thermal image generator is located inside the transfer device, wherein the control device is further configured to generate, by the thermal image generator, the in-apparatus thermal image in a state in which a jig is located inside the substrate processing apparatus, the jig being configured to be transferred by the substrate transfer mechanism and including a reflecting member configured to reflect an infrared ray toward the thermal image generator, and wherein the jig has a shape corresponding to the substrate.

2. The substrate processing system of claim 1, wherein the substrate processing apparatus includes a temperature adjuster configured to adjust a temperature of a constituent member of the substrate processing apparatus, and the control device is further configured to control the temperature adjuster based on the generated in-apparatus thermal image.

3. The substrate processing system of claim 2, wherein a temperature adjustment target to be adjusted by the temperature adjuster is at least one of a stage on which the substrate is placed or a wall of a processing container in which the stage is accommodated, and the control device is further configured to generate, by the thermal image generator, the in-apparatus thermal image including the thermal image of the temperature adjustment target.

4. The substrate processing system of claim 3, wherein the control device is further configured to control the temperature adjuster based on the thermal image of the temperature adjustment target such that a surface temperature of the temperature adjustment target on a processing space side becomes a desired temperature.

5. The substrate processing system of claim 4, wherein the control device is further configured to determine whether the substrate processing apparatus requires maintenance based on the acquired in-apparatus thermal image.

6. The substrate processing system of claim 5, wherein the control device is further configured to determine whether the constituent member of the substrate processing apparatus requires the maintenance based on the acquired in-apparatus thermal image.

7. The substrate processing system of claim 6, wherein the control device is configured to determine that the substrate processing apparatus requires maintenance when a temperature indicated by the in-apparatus thermal image exceeds a threshold.

8. The substrate processing system of claim 7, further comprising:

a notifier configured to, when the control device determines that the substrate processing apparatus requires the maintenance, notify the substrate processing apparatus requires the maintenance.

9. The substrate processing system of claim 8, further comprising:

a capturing device provided on the substrate transfer mechanism, wherein the control device is further configured to control the capturing device to capture an image of a portion of the substrate processing apparatus, which corresponds to a specific portion of the in-apparatus thermal image.

10. The substrate processing system of claim 2, wherein the substrate processing system comprises two or more of the substrate processing apparatus, and the control device is further configured to:

acquire the in-apparatus thermal image for each of the two or more of the substrate processing apparatus; and compare the in-apparatus thermal images of the two or more of the substrate processing apparatus with each other and control a respective temperature adjuster of each corresponding substrate processing apparatus based on a comparison result.

11. The substrate processing system of claim 4, wherein the substrate processing system comprises two or more of the substrate processing apparatus, and the control device is further configured to:

acquire the in-apparatus thermal image for each of the two or more of the substrate processing apparatus; and compare the in-apparatus thermal images of the two or more of the substrate processing apparatus with each other and control a respective temperature adjuster of each corresponding substrate processing apparatus based on a comparison result.

12. The substrate processing system of claim 5, wherein the control device is configured to determine that the substrate processing apparatus requires maintenance when a temperature indicated by the in-apparatus thermal image exceeds a threshold.

13. The substrate processing system of claim 5, further comprising:

a notifier configured to, when the control device determines that the substrate processing apparatus requires the maintenance, notify the substrate processing apparatus requires the maintenance.

14. The substrate processing system of claim 1, wherein the control device is further configured to generate, by the thermal image generator, the in-apparatus thermal image in a state in which the thermal image generator is located inside the substrate processing apparatus.

15. The substrate processing system of claim 1, wherein the substrate processing apparatus includes a temperature adjuster configured to adjust a temperature of a constituent member of the substrate processing apparatus, and the control device is further configured to control the temperature adjuster based on the generated in-apparatus thermal image.

16. The substrate processing system of claim 1, wherein the control device is further configured to determine whether the substrate processing apparatus requires maintenance based on the acquired in-apparatus thermal image.

17. The substrate processing system of claim 1, further comprising:

a capturing device provided on the substrate transfer mechanism, wherein the control device is further configured to control the capturing device to capture an image of a portion of the substrate processing apparatus, which corresponds to a specific portion of the in-apparatus thermal image.

18. A method of monitoring, in a substrate processing system including a substrate processing apparatus configured to execute a predetermined processing on a substrate and a transfer device, an internal temperature of the substrate processing apparatus, wherein, in the substrate processing system, the substrate processing apparatus includes a loading/unloading port for the substrate, the transfer device is connected to the substrate processing apparatus via an opening/closing mechanism configured to open/close the loading/unloading port, and includes a substrate transfer mechanism configured to load and unload the substrate into and from the substrate processing apparatus via the loading/unloading port, and the substrate processing system further includes a thermal image generator provided on the substrate transfer mechanism and configured to generate a thermal image, the method comprises:

opening, by the opening/closing mechanism, the loading/unloading port at a time before and/or after the substrate processing apparatus executes the predetermined processing; and generating, by the thermal image generator, an in-apparatus thermal image as the thermal image indicating a temperature distribution inside the substrate processing apparatus, and wherein the method further comprises: generating, by the thermal image generator, the in-apparatus thermal image in a state in which the thermal image generator is located inside the transfer device, and wherein the method further comprises: generating, by the thermal image generator, the in-apparatus thermal image in a state in which a jig is located inside the substrate processing apparatus, the jig being configured to be transferred by the substrate transfer mechanism and including a reflecting member configured to reflect an infrared ray toward the thermal image generator, and wherein the jig has a shape corresponding to the substrate.

* * * * *